US008546894B2

(12) United States Patent
Machida et al.

(10) Patent No.: US 8,546,894 B2
(45) Date of Patent: Oct. 1, 2013

(54) CAPACITIVE MICROMACHINED ULTRASONIC TRANSDUCER COMPRISING ELECTRODE ON FLEXIBLE MEMBRANE

(75) Inventors: Shuntaro Machida, Kokubunji (JP); Hiroshi Fukuda, Tokyo (JP)

(73) Assignee: Hitachi Ltd., Tokyo (JP)

( * ) Notice: Subject to any disclaimer, the term of this patent is extended or adjusted under 35 U.S.C. 154(b) by 829 days.

(21) Appl. No.: 11/316,925

(22) Filed: Dec. 27, 2005

(65) Prior Publication Data

US 2006/0179640 A1 Aug. 17, 2006

(30) Foreign Application Priority Data

Jan. 27, 2005 (JP) ................................ 2005-019286

(51) Int. Cl.
*H01L 29/82* (2006.01)

(52) U.S. Cl.
USPC .......................................... 257/415; 257/416

(58) Field of Classification Search
USPC .................. 257/415–420, E29.105, E21.002
See application file for complete search history.

(56) References Cited

U.S. PATENT DOCUMENTS 6,246,158 B1 6/2001 Ladabaum
6,320,239 B1 11/2001 Eccardt et al.
6,562,650 B2 5/2003 Ladabaum
6,571,445 B2 6/2003 Ladabaum
6,584,852 B2 7/2003 Suzuki et al.

FOREIGN PATENT DOCUMENTS

JP 2003-503923 6/2000
JP 2003-21565 7/2001
WO WO 01/01730 A2 6/2000

OTHER PUBLICATIONS

Joshua G. Knight et al., "Fabrication and Characterization of cMUTs for Forward Looking Intravascular Ultrasound Imaging", 2003 IEEE Ultrasonics Symposium, pp. 577-580.
Office Action from the Japanese Patent Office dated May 26, 2009 in Japanese.
Office Action from the Japanese Patent Office, dated May 26, 2009 (translation).

*Primary Examiner* — Cuong Q Nguyen
(74) *Attorney, Agent, or Firm* — Stites & Harbison PLLC; Juan Carlos A. Marquez

(57) ABSTRACT

A technology capable of preventing the degradation of operation reliability of CMUT when a lower electrode for CMUTs arranged in an array is divided in order to control the CMUTs independently is provided. Also, a technology capable of preventing the formation of a convex or concave distortion in an insulating film (membrane) of the cavity is provided. For its achievement, a size of a lower electrode divided for independently controlling each CMUT is set to be larger than that of a cavity. Also, a size of an upper electrode of the CMUT is set to be larger than that of the cavity.

2 Claims, 17 Drawing Sheets

CAPACITIVE MICROMACHINED ULTRASONIC TRANSDUCER COMPRISING ELECTRODE ON FLEXIBLE MEMBRANE

CROSS-REFERENCE TO RELATED APPLICATION

The present application claims priority from Japanese Patent Application No. JP 2005-19286 filed on Jan. 27, 2005, the content of which is hereby incorporated by reference into this application.

TECHNICAL FIELD OF THE INVENTION

The present invention relates to an ultrasonic transducer and a method for manufacturing the same. More particularly, it relates to an ultrasonic transducer and an ultrasonic transducer array manufactured by MEMS (micro electronic mechanical system) technology, and an optimal manufacturing method thereof.

BACKGROUND OF THE INVENTION

An ultrasonic transducer is used to diagnose a tumor in a human body or the like by transmitting and receiving ultrasonic waves.

Although an ultrasonic transducer utilizing vibrations of a piezoelectric member has been used up to now, a capacitive micromachined ultrasonic transducer (CMUT) whose vibration portion is formed on a silicon substrate has been under extensive development for its practical use according to the advance of the MEMS technology in recent years.

U.S. Pat. No. 6,320,239B1 specification (Patent Document 1) discloses a single CMUT and CMUTs arranged in an array.

U.S. Pat. No. 6,571,445B2 specification (Patent Document 2) and U.S. Pat. No. 6,562,650B2 specification (Patent Document 3) disclose a technology for forming a CMUT on an upper layer of a signal processing circuit formed on a silicon substrate.

"2003 IEEE ULTRASONIC SYMPOSIUM" pp. 577 to 580 (Non-Patent Document 1) discloses a technology in which a lower electrode is formed to be larger than a cavity layer in a CMUT.

SUMMARY OF THE INVENTION

The CMUT has such advantages that it has a frequency band of ultrasonic waves wider than that of a conventional transducer using a piezoelectric member and has a higher sensitivity than that of the conventional transducer. Also, since the CMUT is fabricated by using LSI process technology, it can be miniaturized. Especially, in the case where a plurality of ultrasonic devices are arranged in an array and they are controlled independently of one another, it is considered essential to use the CMUTs. This is because, though it is considered that wirings to respective devices are required and the number of wirings in an array becomes enormous, the CMUTs can achieve the mixed loading of a signal processing circuit from wirings and further an ultrasonic wave transmission and reception portion to one chip.

Basic structure and operation of a CMUT will be described with reference to FIG. 1. In the structure of the CMUT, a cavity (cavity layer) 102 is formed in an upper layer of a lower electrode 101, and the cavity 102 is enclosed by a membrane 103. An upper electrode 104 is disposed on an upper surface of the membrane 103. Note that the lower electrode 101 shown in FIG. 1 is a common electrode for a plurality of CMUTs, and it is not separated and not independently controlled for each of the CMUTs.

When a DC voltage and an AC voltage are superimposed between the upper electrode 104 and the lower electrode 101, an electrostatic force acts between the upper electrode 104 and the lower electrode 101, and the membrane 103 and the upper electrode 104 vibrate at a frequency of the applied AC voltage, thereby transmitting the ultrasonic waves.

On the contrary, in the reception of ultrasonic waves, the membrane 103 and the upper electrode 104 vibrate due to the pressure of ultrasonic waves which reach a surface of the membrane 103. Then, since a distance between the upper electrode 104 and the lower electrode 101 varies due to the vibrations, the ultrasonic waves can be detected as the change in capacitance.

As is apparent from the above-described operation principle, since transmission and reception of ultrasonic waves are conducted by utilizing the vibrations of the membrane due to the change in electrostatic force between the electrodes and the change in capacitance between the electrodes due to the vibrations, a thickness control of a cavity and a shape control of the membrane are important for the stable operation and improvement in device reliability.

In Patent Document 1, a CMUT array using a silicon substrate surface as a common lower electrode is formed on the silicon substrate on which a signal processing circuit is formed.

Since the silicon substrate is utilized as the lower electrode, the formation of the cavity and the membrane can be conducted on a planarized flat surface, and shapes of the cavity and the membrane are not influenced by the protrusion of the base member.

However, since the silicon substrate is used as the common lower electrode, respective CMUTs cannot be controlled individually. Also, since the CMUTs and the signal processing circuit are formed on the same substrate laterally, it has a relatively large area as a chip on which the CMUTs and the signal processing circuit are mounted, which results in such a problem that a manufacturing cost per one chip becomes large.

As the solution for this problem, methods for forming CMUTs on an upper layer of a signal processing circuit formed on a silicon substrate are described in Patent Document 2 and Patent Document 3. Since lower electrodes of the CMUTs are separately provided for the respective CMUTs, respective CMUTs can be controlled individually and independently. Further, since the CMUTs are formed on an upper layer of the signal processing circuit, an area of the chip becomes smaller than that obtained by the technology disclosed in Patent Document 1, which leads to cost reduction of the chip.

However, since the sizes of the upper electrode and the lower electrode are made smaller than the size of the cavity in order to reduce parasitic capacitance between the upper electrode and the lower electrode, protrusion of the lower electrode is reflected on shape of the membrane, and stress is excessively applied to a specific portion (corner portion) of the membrane. Therefore, cracking or breaking occurs in the membrane and the operation reliability of the CMUTs is degraded. For its prevention, a process for performing CMP (Chemical Mechanical Polishing) after the formation of a lower electrode to planarize an upper layer of the lower electrode has also been disclosed. However, since controllable polishing film thickness is limited and partially excessive polishing occurs such as dishing or erosion in the current CMP technology, precision required for processing the CMUT cannot be achieved. Further, since the size of the upper electrode is smaller than that of the cavity, the membrane does not have uniform film quality and film thickness, and the distortion of the membrane easily occurs due to residual stress of a material. More specifically, since the size of the upper electrode is smaller than the size of the membrane, the upper electrode is formed on only a part of the membrane. Accordingly, since film quality and film thickness of a film formed on the membrane is not uniform over the entire membrane, distortion easily occurs in the membrane due to, for example, residual stress of a conductor film constituting the upper electrode.

An object of the present invention is to provide a technology capable of preventing the degradation of operation reliability due to the stress applied to a specific portion of a membrane formed by reflecting the protrusion of a base member resulting from the lower electrode when a lower electrode for CMUTs arranged in an array is divided in order to control the CMUTs independently.

Another object of the present invention is to provide a technology capable of preventing the formation of a convex or concave distortion on the membrane due to residual stress present in an upper stacked film when the stacked film on the membrane does not have uniform film quality and film thickness. More specifically, the present invention is to provide a technology which can form the CMUT as designed and can prevent the sensitivity degradation.

The above and other objects and novel characteristics of the present invention will be apparent from the description of this specification and the accompanying drawings.

The typical ones of the inventions disclosed in this application will be briefly described as follows.

An ultrasonic transducer according to the present invention comprises: (a) a first electrode which can be controlled independently by an individual ultrasonic transducer; (b) a cavity layer which is formed on the first electrode; (c) an insulating film which is formed so as to cover the cavity layer; and (d) a second electrode which is formed on the insulating film, wherein a size of the second electrode is larger than that of the cavity layer.

Also, a method for manufacturing an ultrasonic transducer according to the present invention comprises: (a) a step of forming a first electrode which can be controlled independently by an individual ultrasonic transducer; (b) a step of forming a sacrifice layer on the first electrode; (c) a step of forming a first insulating film so as to cover the sacrifice layer; (d) a step of forming a second electrode on the first insulating film; (e) a step of forming a second insulating film so as to cover the second electrode and the first insulating film; (f) a step of forming an opening which penetrates the first insulating film and the second insulating film to reach the sacrifice layer; and (g) a step of forming a cavity layer by removing the sacrifice layer utilizing the opening, wherein the second electrode is formed so as to be larger than the cavity layer.

The effects obtained by typical aspects of the present invention will be briefly described below.

When a size of each of the lower electrodes divided in order to control respective CMUTs independently is made larger than a size of the cavity, the membrane can be formed without being influenced by the protrusion of a base member, and the improvement in CMUT operation reliability can be achieved. Also, when the size of the upper electrode of the CMUT is made larger than that of the cavity, the stacked film on the membrane can have uniform film quality and film thickness, and the distortion of the membrane can be suppressed. Therefore, since CMUT structure control is facilitated, the CMUT can be formed as designed and sensitivity degradation due to the distortion of the membrane can be prevented.

BRIEF DESCRIPTIONS OF THE DRAWINGS

DESCRIPTIONS OF THE PREFERRED EMBODIMENTS

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof.

Also, in the embodiments described below, when referring to the number of elements (including number of pieces, values, amount, range, and the like), the number of the elements is not limited to a specific number unless otherwise stated or except the case where the number is apparently limited to a specific number in principle. The number larger or smaller than the specified number is also applicable.

Further, in the embodiments described below, it goes without saying that the components (including element steps) are not always indispensable unless otherwise stated or except the case where the components are apparently indispensable in principle.

Similarly, in the embodiments described below, when the shape of the components, positional relation thereof, and the like are mentioned, the substantially approximate and similar shapes and the like are included therein unless otherwise stated or except the case where it can be conceived that they are apparently excluded in principle. This condition is also applicable to the numerical value and the range described above.

Also, hatching is used in some cases even in a plan view so as to make the drawings easy to see.

In the description of the embodiments below, an object to manufacture a CMUT with high structural reliability can be achieved by defining a relative size of electrodes and a cavity.

First Embodiment

Figure 1:
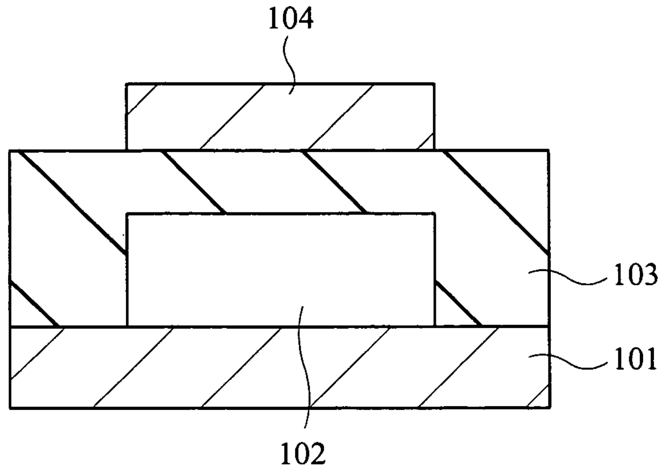
FIG. 1 is a cross-sectional view showing an ultrasonic transducer examined by the inventors of the present invention.
Figure 2:
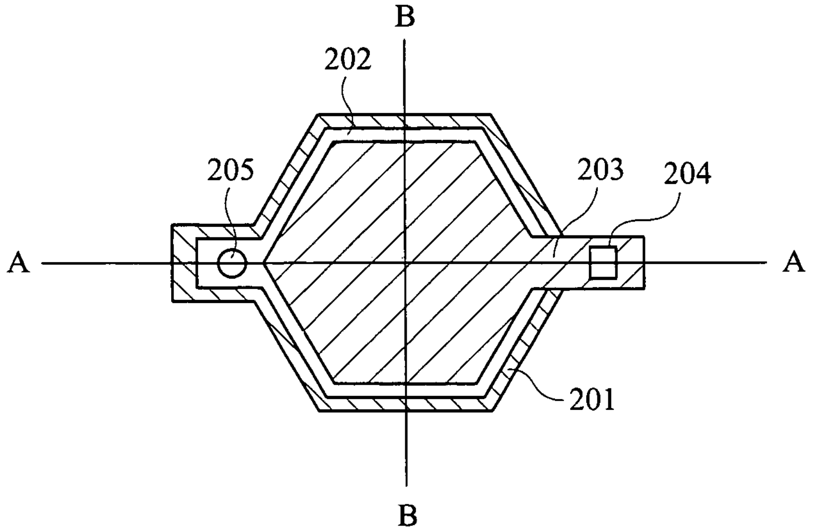
FIG. 2 is a top plan view showing an ultrasonic transducer according to a first embodiment of the present invention.

FIG. 2 is a top plan view of one CMUT. Reference numeral 201 denotes a lower electrode, 202 denotes a cavity (cavity layer), 203 denotes an upper electrode, 204 denotes a plug connected to the upper electrode, and 205 denotes a wet etching hole for forming the cavity 202. More specifically, the wet etching hole 205 is connected to the cavity 202. In fact, since the cavity 202 is enclosed by an insulating film, it cannot be seen from the above, but it is shown in FIG. 2 for easy understanding. As understood from the top plan view, one feature of the first embodiment lies in that a size of the lower electrode 201 is larger than that of the cavity 202. That is, an area of the lower electrode 201 is larger than that of the cavity 202, and the cavity 202 is included in the lower electrode 201. Specifically, for example, the lower electrode 201, the cavity 202, and the upper electrode 203 are each formed in an approximately hexagonal shape, where a length of a diagonal line (diameter) of the lower electrode 201 is about 55 μm and a length of a diagonal line (diameter) of the cavity 202 is about 50 μm. Note that FIG. 2 is a plan view, but hatching is applied thereto for easy understanding.

Figure 3A:
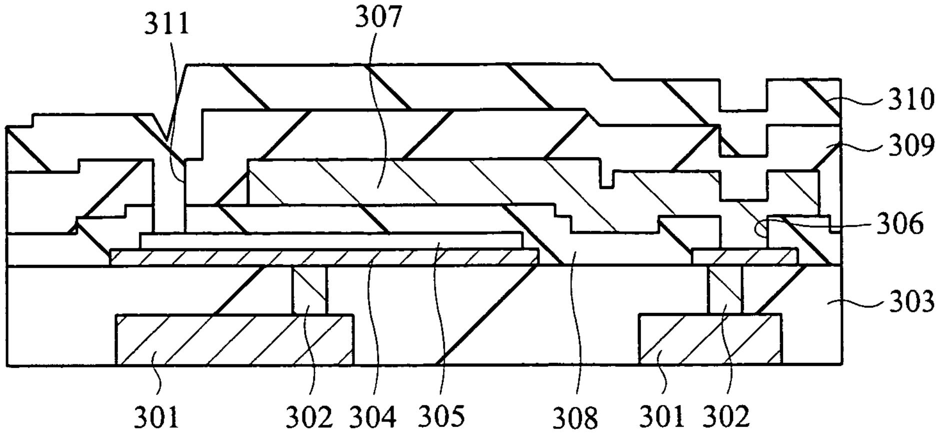
FIG. 3A is a cross-sectional view taken along the line A-A in FIG. 2.
Figure 3B:
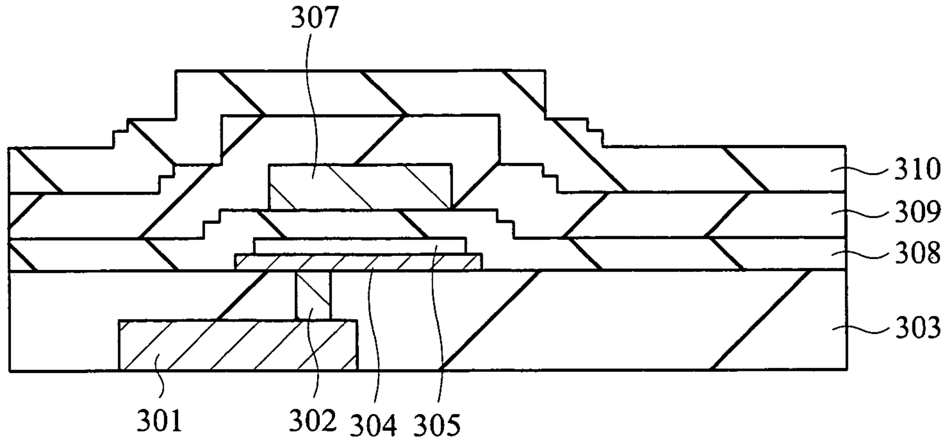
FIG. 3B is a cross-sectional view taken along the line B-B in FIG. 2.

FIG. 3A is a cross-sectional view taken along the line A-A in FIG. 2, and FIG. 3B is a cross-sectional view taken along the line B-B in FIG. 2. As shown in FIG. 3A and FIG. 3B, wiring layers 301 formed on a semiconductor substrate are electrically connected to a lower electrode 304 (corresponding to the lower electrode 201 in FIG. 2) and an upper electrode 307 (corresponding to the upper electrode 203 in FIG. 2) of a CMUT through vias 302 formed in an interlayer insulating film 303. A cavity 305 (corresponding to the cavity 202 in FIG. 2) is formed on the lower electrode 304. A size of the lower electrode 304 is larger than that of the cavity 305. An insulating film (membrane) 308 is formed so as to enclose the cavity 305, and the upper electrode 307 is formed on the insulating film 308. The upper electrode 307 and the wiring layer 301 are electrically connected to each other through a plug 306. An insulating film 309 and an insulating film 310 are formed on the upper electrode 307. Also, a hole 311 penetrating the insulating film 308 and the insulating film 309 is formed in these films. The hole 311 is formed for forming the cavity 305, and an insulating film 310 is buried in the hole 311 after forming the cavity 305.

As shown in FIG. 2 and FIG. 3A and FIG. 3B, a feature of the first embodiment lies in that the size of the lower electrode 304 is set to be larger than that of the cavity 305. In such a structure, the cavity 305 can be formed without being influenced by the protrusion of the lower electrode 304. That is, when the lower electrode 304 is smaller than the cavity 305, the protrusion is formed in the cavity 305. More specifically, the protrusion is reflected on the shape of the insulating film 308 enclosing the cavity 305, and a corner (projection) is formed inside the cavity 305. Since stress easily acts on such a corner portion, cracking or breaking tends to occur. Therefore, the insulating film 308 is damaged, which causes the degradation in CMUT operation reliability. In the first embodiment, however, since the size of the lower electrode 304 is made larger than that of the cavity 305, the protrusion does not occur in the cavity 305. Accordingly, the corner portion is not formed in the insulating film 308. That is, in the first embodiment, since a corner portion does not occur in the insulating film 308, local concentration of stress can be prevented and stress can be relaxed or reduced. Therefore, CMUT operation reliability can be improved.

Next, a manufacturing method of the CMUT described in the first embodiment will be described with reference to the drawings. FIGS. 4A, 5A, 6A, 7A, 8A, 9A, 10A, 11A, and 12A are cross-sectional views taken along the line A-A in FIG. 2, and FIGS. 4B, 5B, 6B, 7B, 8B, 9B, 10B, 11B, and 12B are cross-sectional views taken along the line B-B in FIG. 2.

Figure 4A:
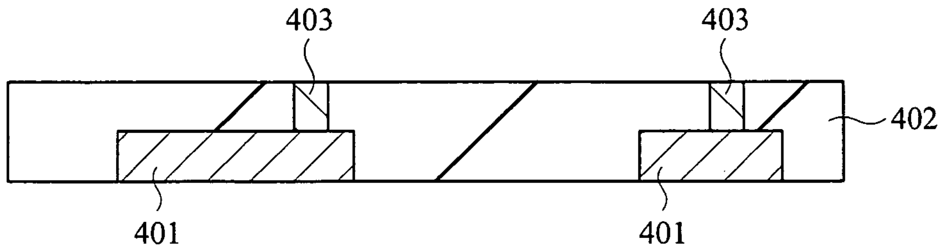
FIG. 4A is a cross-sectional view taken along the line A-A in FIG. 2, showing a manufacturing process of the ultrasonic transducer.
Figure 4B:
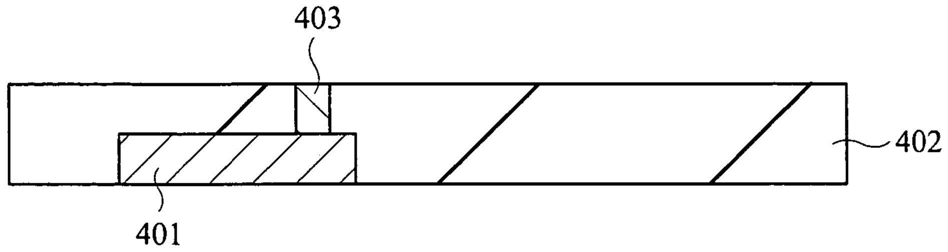
FIG. 4B is a cross-sectional view taken along the line B-B in FIG. 2, showing a manufacturing process of the ultrasonic transducer.

First, as shown in FIG. 4A and FIG. 4B, wirings 401 are formed by stacking a titanium nitride film, an aluminum alloy film, and another titanium nitride film. Then, a silicon oxide film (interlayer insulating film) 402 with a thickness of about 700 nm is deposited on the wirings 401 by plasma CVD (Chemical Vapor Deposition) process. Thereafter, an upper surface of the silicon oxide film 402 is planarized by CMP process. Next, holes 403 for electrically connecting the wirings 401 and a CMUT described later are formed by using the photolithography technology and dry etching technology. Thereafter, a tungsten film with a thickness which can fill the holes 403 is deposited on the silicon oxide film by the sputtering process. Then, excessive tungsten film deposited on the silicon oxide film is removed by CMP process. Note that, in the first embodiment, the CMP process is used twice, but the control of a thickness of the silicon oxide film 402 is performed at a control level used in an ordinary LSI manufacturing technology in this stage.

Figure 5A:
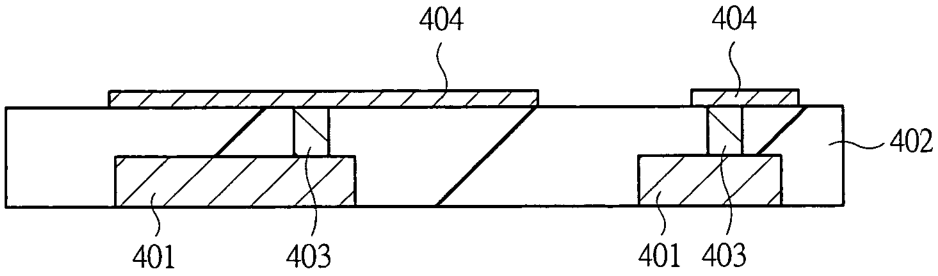
FIG. 5A is a cross-sectional view showing a manufacturing process of the ultrasonic transducer subsequent to FIG. 4A.
Figure 5B:
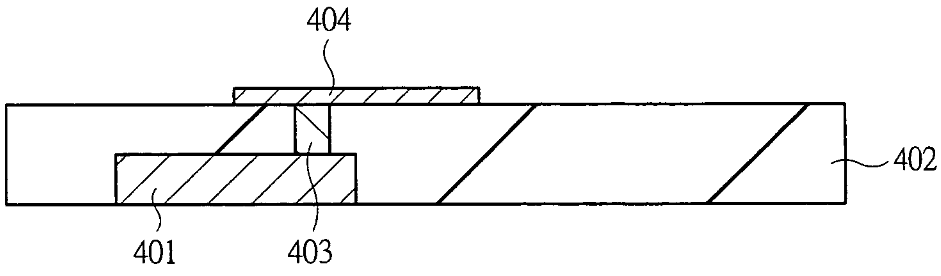
FIG. 5B is a cross-sectional view showing a manufacturing process of the ultrasonic transducer subsequent to FIG. 4B.

Next, a tungsten film with a thickness of about 100 nm is deposited by the sputtering process on upper surfaces of the silicon oxide film 402 and the tungsten film in the holes 403 planarized by the CMP process. Then, lower electrodes 404 are formed by the photolithography technology and dry etching technology (FIG. 5A and FIG. 5B).

Figure 6A:
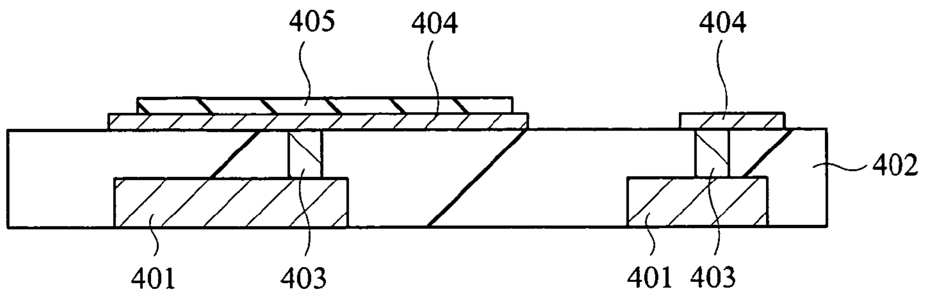
FIG. 6A is a cross-sectional view showing a manufacturing process of the ultrasonic transducer subsequent to FIG. 5A.
Figure 6B:
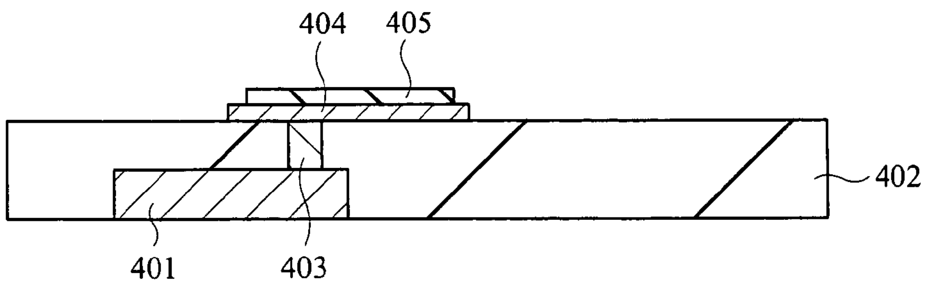
FIG. 6B is a cross-sectional view showing a manufacturing process of the ultrasonic transducer subsequent to FIG. 5B.

Next, an SOG (Spin-On-Glass) film with a thickness of about 100 nm is deposited on upper surfaces of the lower electrodes 404 and the silicon oxide film 402 by the coating process. Then, the SOG film whose size is smaller than that of the lower electrode 404 is left by photolithography technology and dry etching technology. The left part (SOG film) is to be used as a sacrifice layer 405 and the sacrifice layer 405 becomes a cavity in the following process (FIG. 6A and FIG. 6B).

Figure 7A:
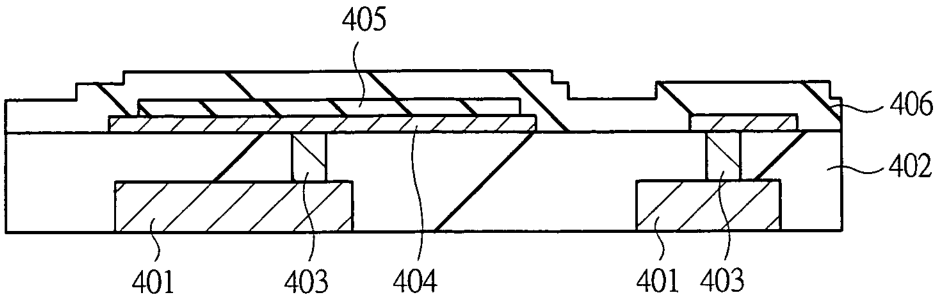
FIG. 7A is a cross-sectional view showing a manufacturing process of the ultrasonic transducer subsequent to FIG. 6A.
Figure 7B:
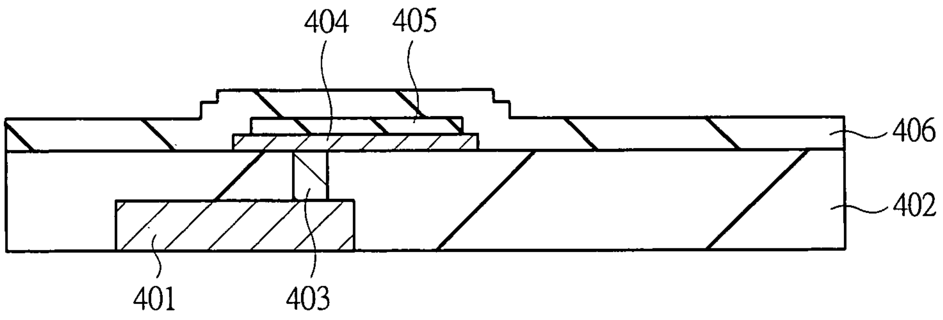
FIG. 7B is a cross-sectional view showing a manufacturing process of the ultrasonic transducer subsequent to FIG. 6B.

Subsequently, a silicon nitride film 406 with a thickness of 200 nm is deposited so as to cover the sacrifice layer 405, the lower electrodes 404, and the silicon oxide film 402 by the plasma CVD process (FIG. 7A and FIG. 7B).

Figure 8A:
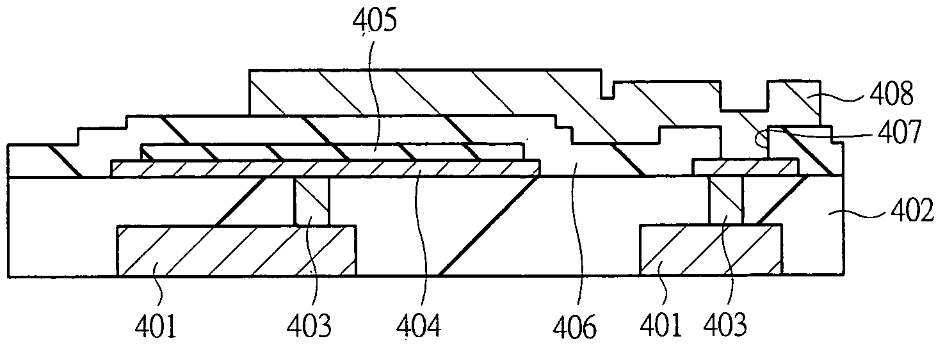
FIG. 8A is a cross-sectional view showing a manufacturing process of the ultrasonic transducer subsequent to FIG. 7A.
Figure 8B:
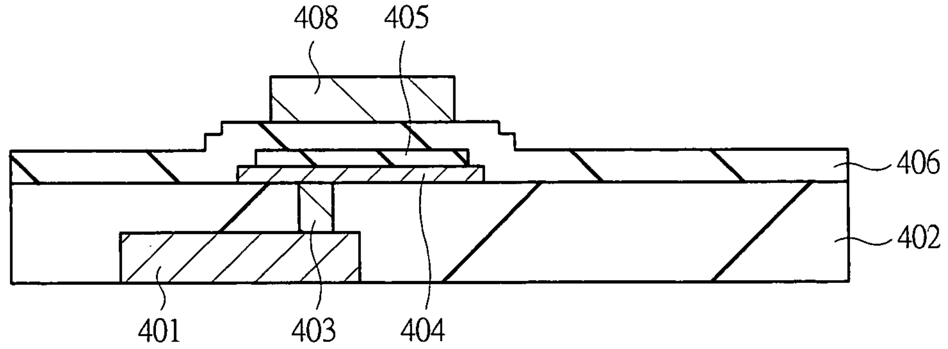
FIG. 8B is a cross-sectional view showing a manufacturing process of the ultrasonic transducer subsequent to FIG. 7B.

Next, an opening 407 is formed in the silicon nitride film 406 by using the photolithography technology and dry etching technology. Thereafter, in order to form an upper electrode 408 of the CMUT, stacked films of a titanium nitride film, an aluminum alloy film, and a titanium nitride film are deposited to have thicknesses of 50 nm, 300 nm, and 50 nm, respectively by the sputtering process. Then, the upper electrode 408 is formed by the photolithography technology and dry etching technology (FIG. 8A and FIG. 8B). Here, since the opening 407 is formed in the silicon nitride film 406 in advance, the upper electrode 408 and the wiring 401 can be electrically connected to each other by burying the upper electrode 408 in the opening 407 simultaneously with the formation of the upper electrode 408.

Figure 9A:
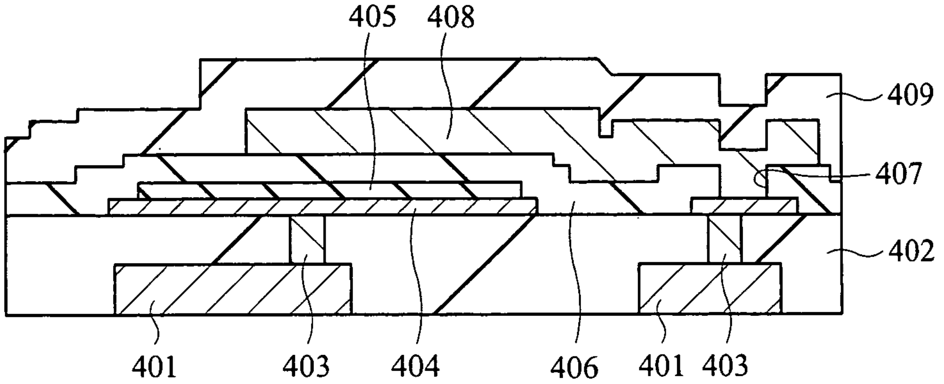
FIG. 9A is a cross-sectional view showing a manufacturing process of the ultrasonic transducer subsequent to FIG. 8A.
Figure 9B:
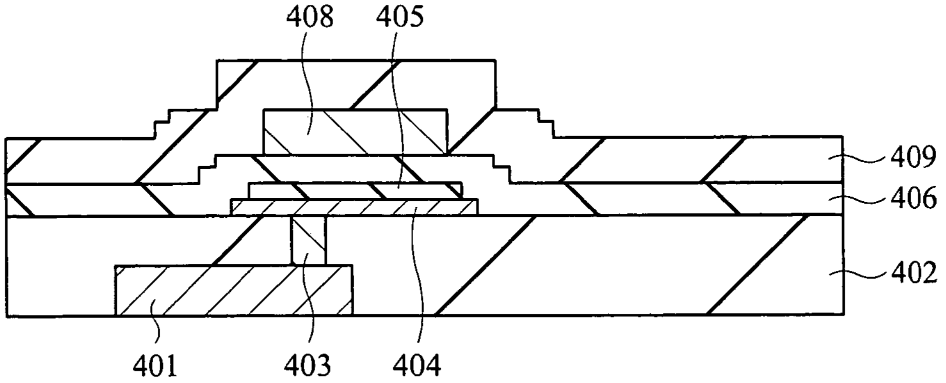
FIG. 9B is a cross-sectional view showing a manufacturing process of the ultrasonic transducer subsequent to FIG. 8B.

Next, a silicon nitride film 409 with a thickness of 300 nm is deposited so as to cover the silicon nitride film 406 and the upper electrode 408 by the plasma CVD process (FIG. 9A and FIG. 9B).

Figure 10A:
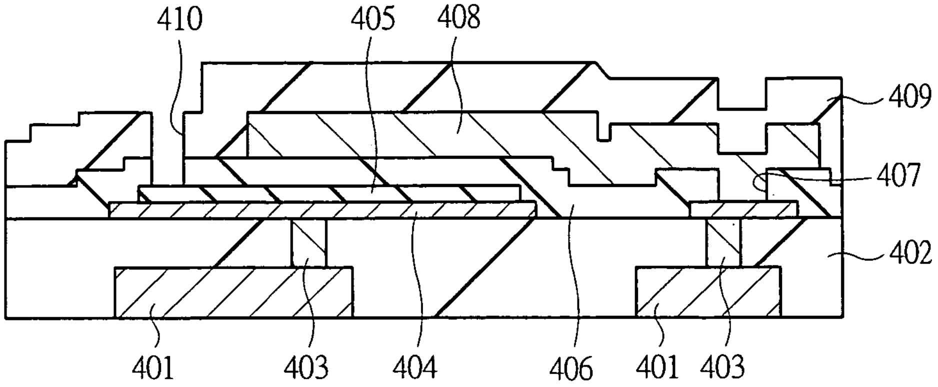
FIG. 10A is a cross-sectional view showing a manufacturing process of the ultrasonic transducer subsequent to FIG. 9A.
Figure 10B:
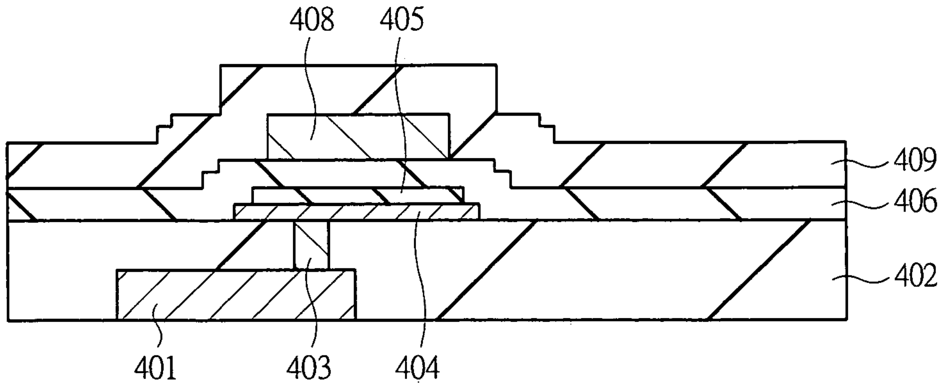
FIG. 10B is a cross-sectional view showing a manufacturing process of the ultrasonic transducer subsequent to FIG. 9B.

Subsequently, an opening 410 which reaches the sacrifice layer 405 is formed in the silicon nitride film 406 and the silicon nitride film 409 by using the photolithography technology and dry etching technology (FIG. 10A and FIG. 10B).

Figure 11A:
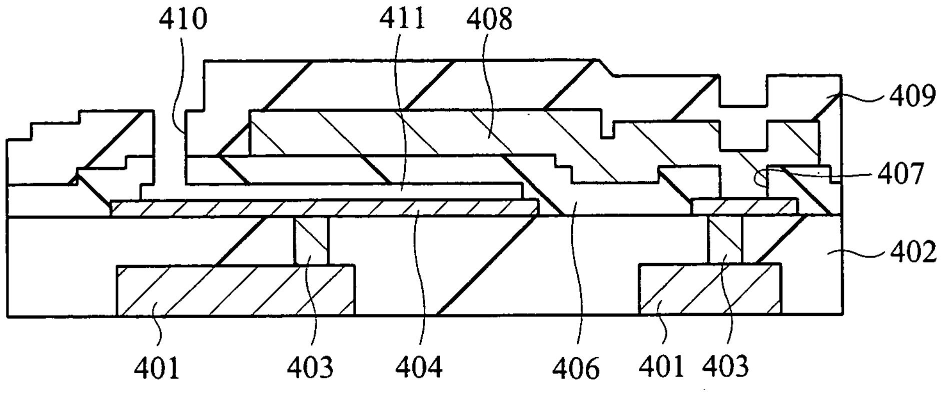
FIG. 11A is a cross-sectional view showing a manufacturing process of the ultrasonic transducer subsequent to FIG. 10A.
Figure 11B:
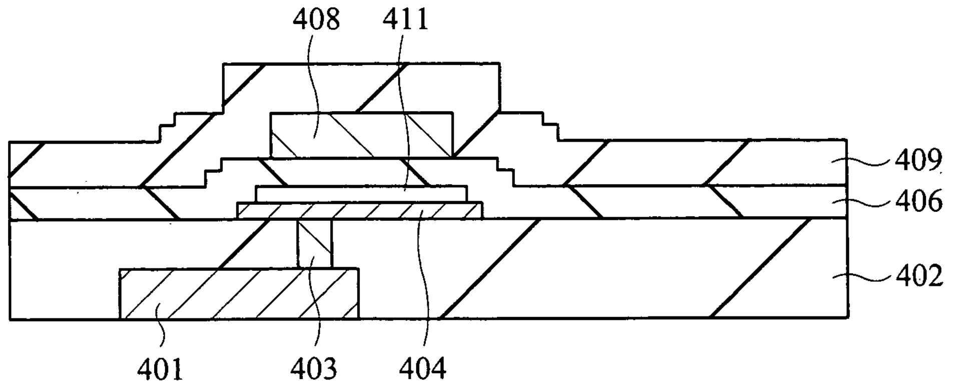
FIG. 11B is a cross-sectional view showing a manufacturing process of the ultrasonic transducer subsequent to FIG. 10B.

Thereafter, a cavity 411 is formed by the wet etching of the sacrifice layer 405 with diluted hydrofluoric acid (FIG. 11A and FIG. 11B).

Figure 12A:
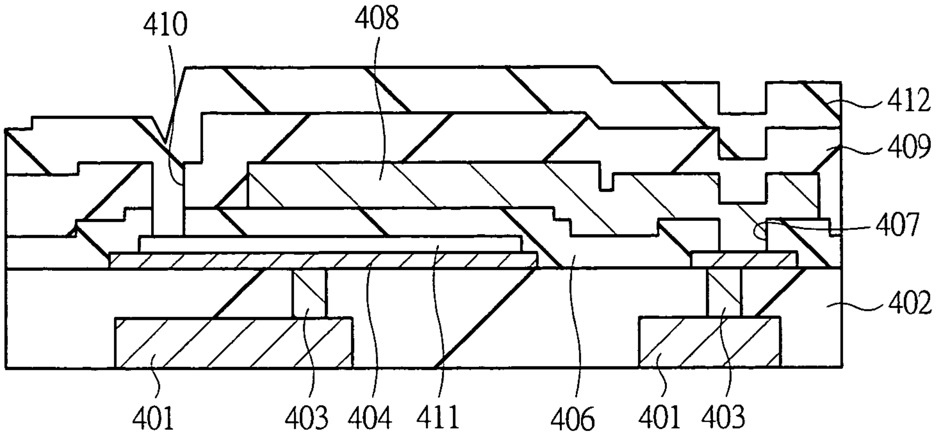
FIG. 12A is a cross-sectional view showing a manufacturing process of the ultrasonic transducer subsequent to FIG. 11A.
Figure 12B:
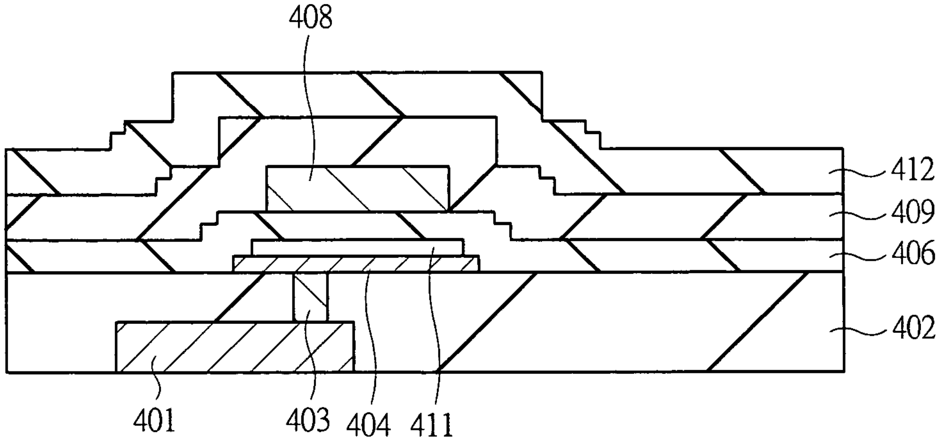
FIG. 12B is a cross-sectional view showing a manufacturing process of the ultrasonic transducer subsequent to FIG. 11B.

Next, a silicon nitride film 412 with a thickness of about 800 nm is deposited by the plasma CVD process in order to bury the silicon nitride film 412 in the opening 410 (FIG. 12A and FIG. 12B). In this manner, the CMUT in the first embodiment can be formed.

Figure 13:
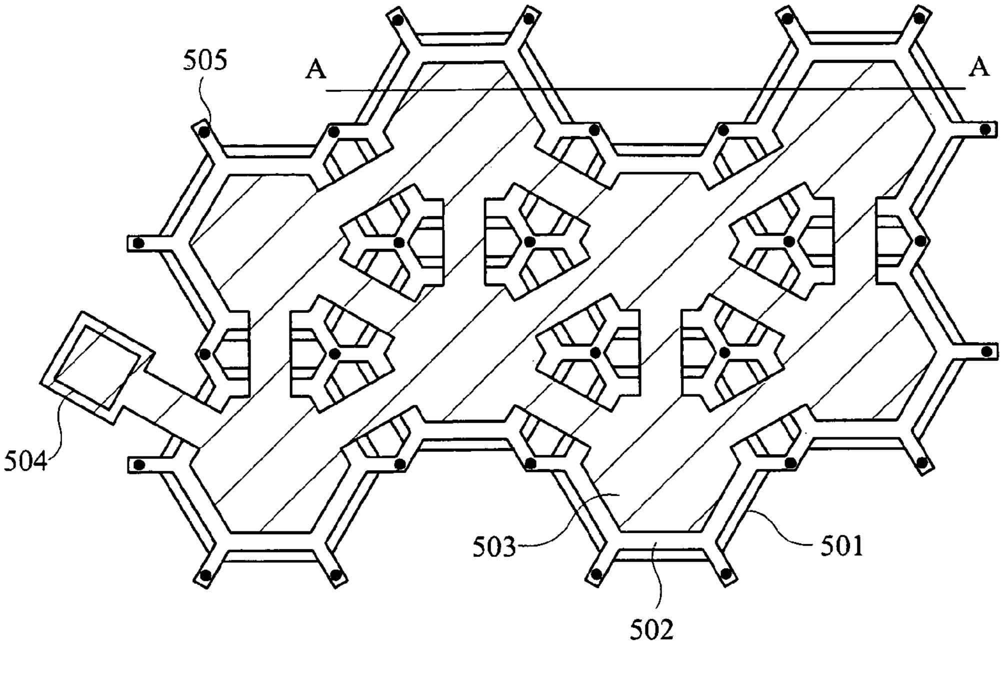
FIG. 13 is a top plan view showing the case where the ultrasonic transducers according to the first embodiment are arranged in an array.

FIG. 13 is a top plan view showing the case where the CMUTs shown in FIG. 2 and FIG. 3 are arranged in an array. Here, a lower electrode 501 is divided for respective CMUTs, and an upper electrode 503 connects all the CMUTs via wirings. More specifically, the respective lower electrodes 501 can be controlled independently by the respective CMUTs. Also, the upper electrode 503 is connected to wiring layers formed in the semiconductor substrate via a plug 504.

The CMUTs are each formed in an approximately hexagonal shape, and they are arranged in an array so as to cover an entire flat surface. In each CMUT, a cavity (cavity layer) 502 is formed between the lower electrode 501 and the upper electrode 503, and the cavity 502 is connected to a wet-etching hole 505 used to form the cavity 502. After forming the cavity 502, the wet-etching hole 505 is filled. Also, the size of the lower electrode 501 is formed to be larger than that of the cavity 502.

Note that, in FIG. 13, each CMUT has the hexagonal shape. However, the shape of the CMUT is not limited to the hexagonal shape, but it may be a circular shape. Even in this case, the size of the lower electrode 501 is made larger than that of the cavity 502. That is, a diameter of the circular lower electrode 501 is larger than a diameter of a circular cavity 502, and the cavity 502 is included in the lower electrode 501.

Figure 14:
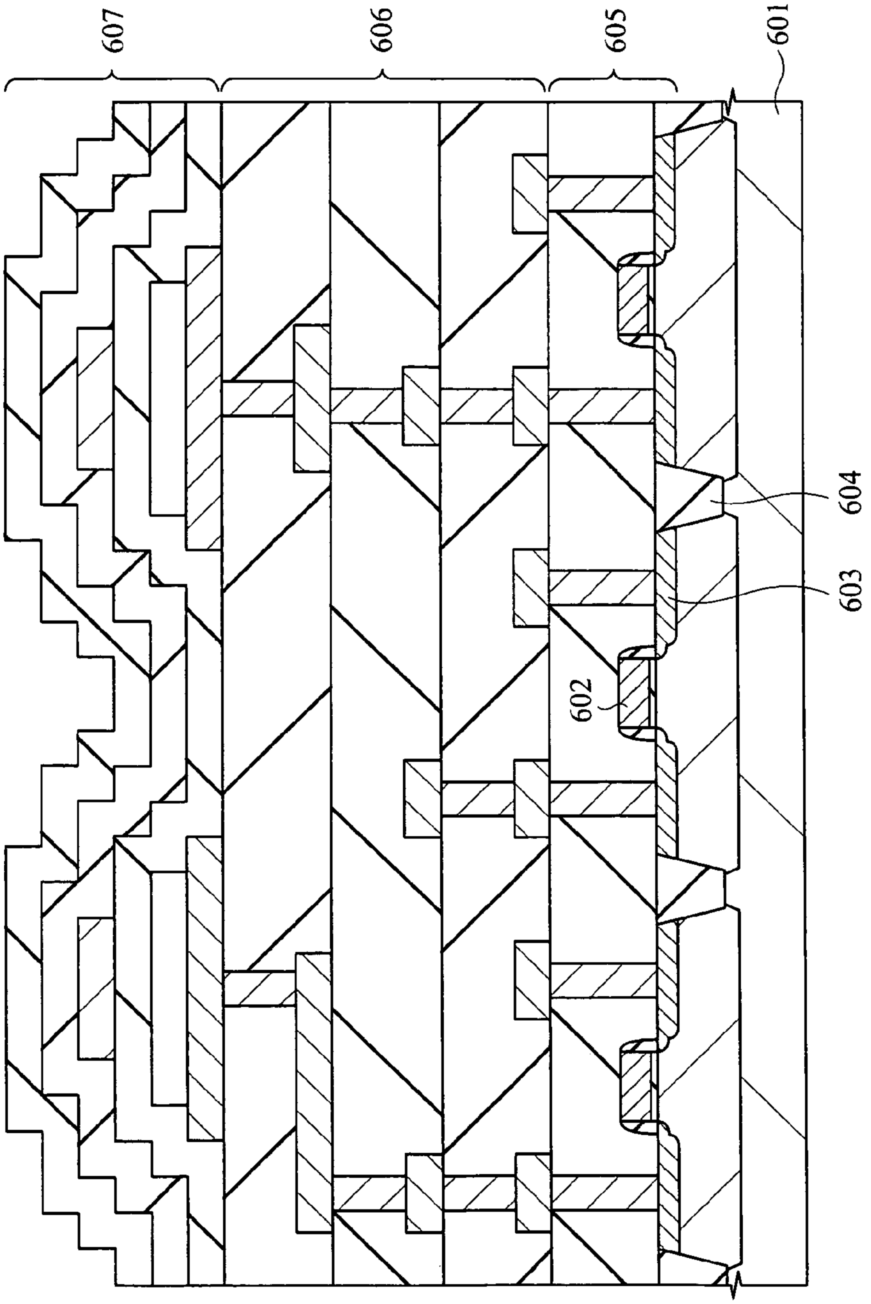
FIG. 14 is a cross-sectional view taken along the line A-A in FIG. 13.

FIG. 14 corresponds to a cross-sectional view taken along the line A-A in FIG. 13 showing the case where the CMUT array is formed on a signal processing circuit. A transistor layer 605 including gate electrodes 602, diffusion layers 603, and device isolation regions 604 is formed on a surface of a semiconductor substrate 601 and a wiring layer 606 is formed on the transistor layer 605 through the ordinary LSI manufacturing process. CMUTs 607 are formed on the wiring layer 606 through the method shown in FIG. 4A to FIG. 12B. Thus, since the CMUTs are formed and stacked on the signal processing circuit, a semiconductor device can be reduced in size in comparison with the case where CMUTs are formed beside a signal processing circuit.

In the CMUT shown as the first embodiment, the size of the lower electrode of the CMUT is larger than that of the cavity. Therefore, a membrane can be formed without being influenced by the protrusion of the base member, and operation reliability of the CMUT can be improved. More specifically, since the size of the lower electrode is set to be larger than that of the cavity, the formation of a corner portion inside the cavity resulting from the protrusion of the base member can be prevented. Consequently, since it is possible to prevent the formation of a corner portion on a membrane to which the stress is readily applied, a membrane which is resistant to the stress can be formed, and the degradation of the operation reliability of a CMUT due to the damage on the membrane can be prevented.

Note that materials for forming the CMUT in the first embodiment are shown as one example of the combination thereof. The material for the upper electrode may be tungsten or another electrically conductive material. Also, the material for the sacrifice layer may be any material as long as it can secure the wet etching selectivity between the sacrifice layer and the material enclosing the sacrifice layer. Accordingly, a silicon oxide film, a polycrystalline silicon film, or a metal film may be used instead of the SOG film.

Second Embodiment

A feature of the CMUT in a second embodiment lies in that a size of an upper electrode is set to be larger than that of a cavity.

Figure 15:
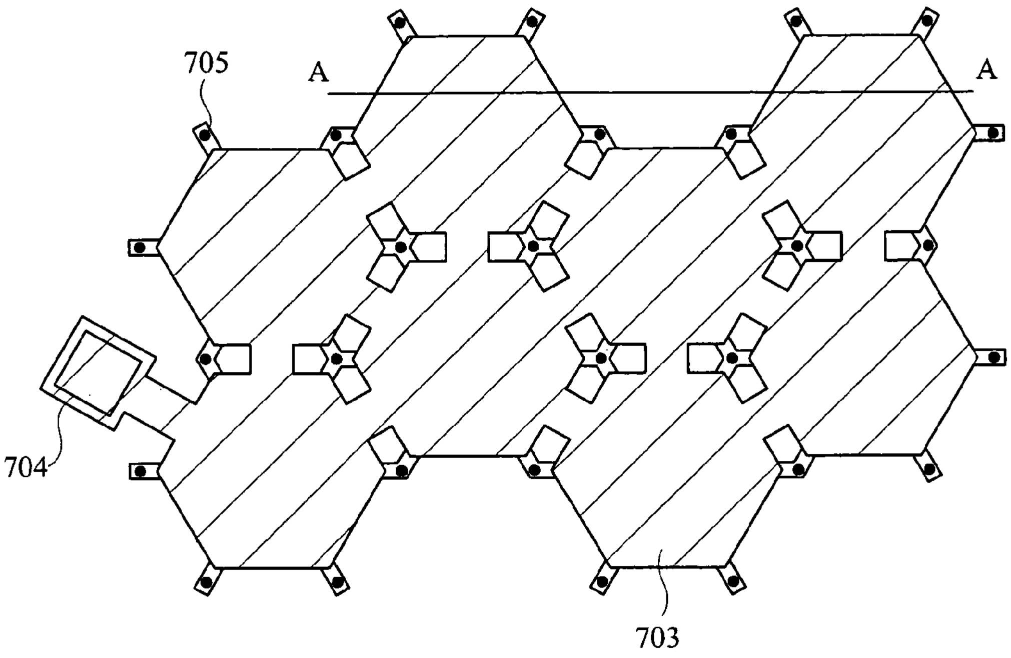
FIG. 15 is a top plan view showing the case where the ultrasonic transducers according to a second embodiment are arranged in an array.

FIG. 15 is a top plan view showing the case where CMUTs having a size of an upper electrode larger than that of a cavity are arranged in an array. Here, a lower electrode is divided for respective CMUTs, and the lower electrodes can be independently controlled by the respective CMUTs. An upper electrode 703 connects all the CMUTs by wirings. Also, the upper electrode 703 is connected to a wiring layer formed on a semiconductor substrate via a plug 704. In addition, a wet-etching hole 705 for forming a cavity is provided in the CMUT. More specifically, the cavity is formed by etching a sacrifice layer (layer embedded in a region in which the cavity is to be formed) through the wet-etching hole 705 reaching the sacrifice layer. Also, the wet-etching hole 705 is filled after the cavity is formed. Note that, in the second embodiment, the upper electrode 703 is formed to be larger than the cavity and the lower electrode. Therefore, in FIG. 15, the lower electrode and the cavity are not shown, because they are concealed by the upper electrode 703. The respective CMUTs are formed in a hexagonal shape, and they are arranged in an array.

Figure 16:
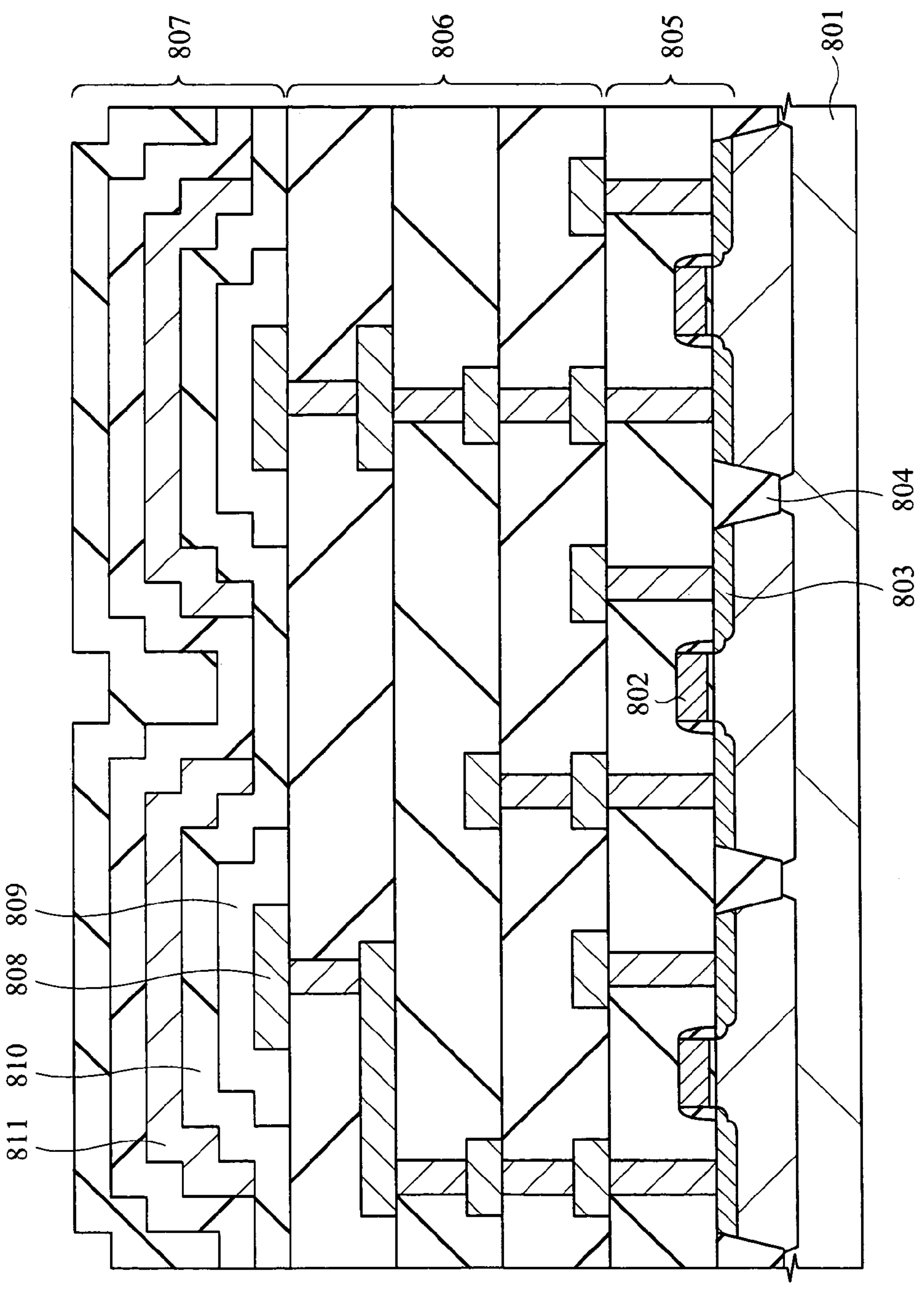
FIG. 16 is a cross-sectional view taken along the line A-A in FIG. 15.

FIG. 16 is a cross-sectional view taken along the line A-A in FIG. 15 in which the CMUT array is formed on a signal processing circuit. A transistor layer 805 including gate electrodes 802, diffusion layers 803, and device isolation regions 804 is formed on a surface of a semiconductor substrate 801 and a wiring layer 806 is formed on the transistor layer 805 through the ordinary LSI manufacturing process. CMUTs 807 are formed on the wiring layer 806.

The CMUT 807 has a lower electrode 808, a cavity 809, an insulating film (membrane) 810, and an upper electrode 811. A size of the upper electrode 811 is set to be larger that that of the cavity 809. That is, an area of the upper electrode 811 is larger than that of the cavity 809, and the cavity 809 is covered with the upper electrode 811. Specifically, for example, the lower electrode 808, the cavity 809, and the upper electrode 811 are each formed in an approximately hexagonal shape, and a length of a diagonal line (diameter) of the upper electrode 811 is about 55 μm and a length of a diagonal line (diameter) of the cavity 809 is about 50 μm. Also, a length of a diagonal line (diameter) of the lower electrode 808 is about 45 μm. Since the size of the upper electrode 811 is set to be larger than that of the cavity 809 in this manner, stacked film formed on the insulating film 810 covering the cavity 809 has uniform film quality and uniform film thickness. Therefore, the distortion of the insulating film 810 can be suppressed.

The insulating film 810 formed on the cavity 809 vibrates at an operating time of the CMUT. It is desired that the vibration is uniform over the insulating film 810. Therefore, it is desired that the stacked film formed on the insulating film 810 has uniform film quality and uniform film thickness. However, when the size of the upper electrode 811 is smaller than the size of the cavity 809, a region where the upper electrode 811 is formed and a region where the upper electrode 811 is not formed are present on the insulating film 810 on the cavity 809. In this case, the structure of the stacked film formed on the insulating film 810 differs between the region where the upper electrode 811 is formed and the region where the upper electrode 811 is not formed. Residual stress remains in the stacked film, and if structure of the stacked film is not uniform, a magnitude of the residual stress is also not uniform due to the difference in structure. Therefore, distortion occurs in the insulating film 810 on the cavity 809 due to, for example, a difference in residual stress between a film constituting the upper electrode 811 and a film where the upper electrode 811 is not formed. When distortion occurs on the insulating film 810, a distance between the lower electrode 808 and the upper electrode 811 changes, and the CMUT cannot be formed as designed. Also, the vibration fluctuates due to the distortion of the insulating film, and the sensitivity of the CMUT is degraded.

In the second embodiment, however, the size of the upper electrode 811 is set to be larger than that of the cavity 809. Therefore, the upper electrode 811 is formed in a region on the cavity 809. More specifically, the upper electrode 811 is formed on a whole region on the insulating film 810 on the cavity 809, and the structure of the stacked film on the insulating film 810 becomes uniform. Accordingly, since there is no difference in residual stress on the cavity 809, the distortion of the insulating film 810 can be suppressed. Therefore, according to the CMUT in the second embodiment, an operation as designed can be realized and detection sensitivity can be improved.

On the other hand, in the CMUT in the second embodiment, since the size of the lower electrode 808 is smaller than that of the cavity 809, the insulating film 810 is formed into a shape which reflects the protrusion of the lower electrode 808. However, by reducing an area of the lower electrode 808, parasitic capacitance between the lower electrode 808 and the upper electrode 811 can be reduced. That is, though a parasitic capacitance becomes larger in proportion to an area of an electrode, since the area of the lower electrode 808 can be reduced, the parasitic capacitance can be reduced in the second embodiment. When the parasitic capacitance is reduced in this manner, the amount of change in capacitance detected by the change in the distance between the lower electrode 808 and the upper electrode 811 by the ultrasonic vibration becomes relatively large. Therefore, a detection sensitivity of the CMUT can be improved in the second embodiment.

The method for manufacturing a CMUT according to the second embodiment is approximately similar to that according to the first embodiment, but the difference therebetween lies in that the size of the upper electrode is set to be larger than that of the cavity and the size of the lower electrode is set to be smaller than that of the cavity.

Note that the materials constituting the CMUT shown in the second embodiment are shown as one example of combination thereof like the first embodiment. The material for the upper electrode may be tungsten or another electrically conductive material. Also, the material for the sacrifice layer may be any material as long as it can secure the wet etching selectivity between the sacrifice layer and the material enclosing the sacrifice layer. Accordingly, a silicon oxide film, a polycrystalline silicon film, or a metal film may be used instead of the SOG film.

Third Embodiment

CMUT according to a third embodiment has a structure obtained by combining the structures of the first and second embodiments. More specifically, a feature of the CMUT in the third embodiment lies in that both a size of the upper electrode and a size of the lower electrode are set to be larger than that of the cavity.

Figure 17:
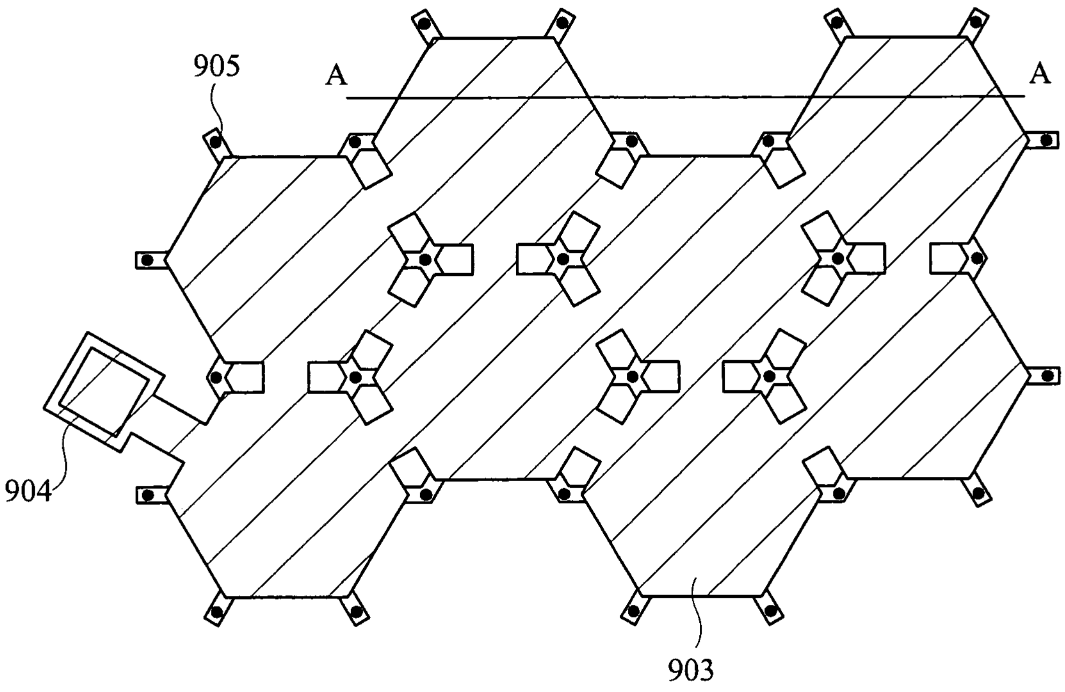
FIG. 17 is a top plan view showing the case where the ultrasonic transducers according to a third embodiment are arranged in an array.

FIG. 17 is a top plan view showing the case where CMUTs having a size of an upper electrode and a size of a lower electrode larger than that of a cavity are arranged in an array. In this case, a lower electrode is divided for respective CMUTs, and the lower electrodes can be independently controlled by the respective CMUTs. An upper electrode 903 connects all the CMUTs by wirings. Also, the upper electrode 903 is connected to a wiring layer formed on a semiconductor substrate via a plug 904. In addition, a wet-etching hole 905 for forming a cavity is formed in the CMUT. More specifically, the cavity is formed by etching a sacrifice layer (layer embedded in a region in which the cavity is to be formed) through the wet-etching hole 905 reaching the sacrifice layer. Also, the wet-etching hole 905 is filled after the cavity is formed. Note that, in the third embodiment, the upper electrode 903 is formed to be larger than those of the cavity and the lower electrode. In FIG. 17, therefore, the lower electrode and the cavity are not shown, because they are concealed by the upper electrode 903. The CMUTs are each formed in a hexagonal shape, and they are arranged in an array.

Figure 18:
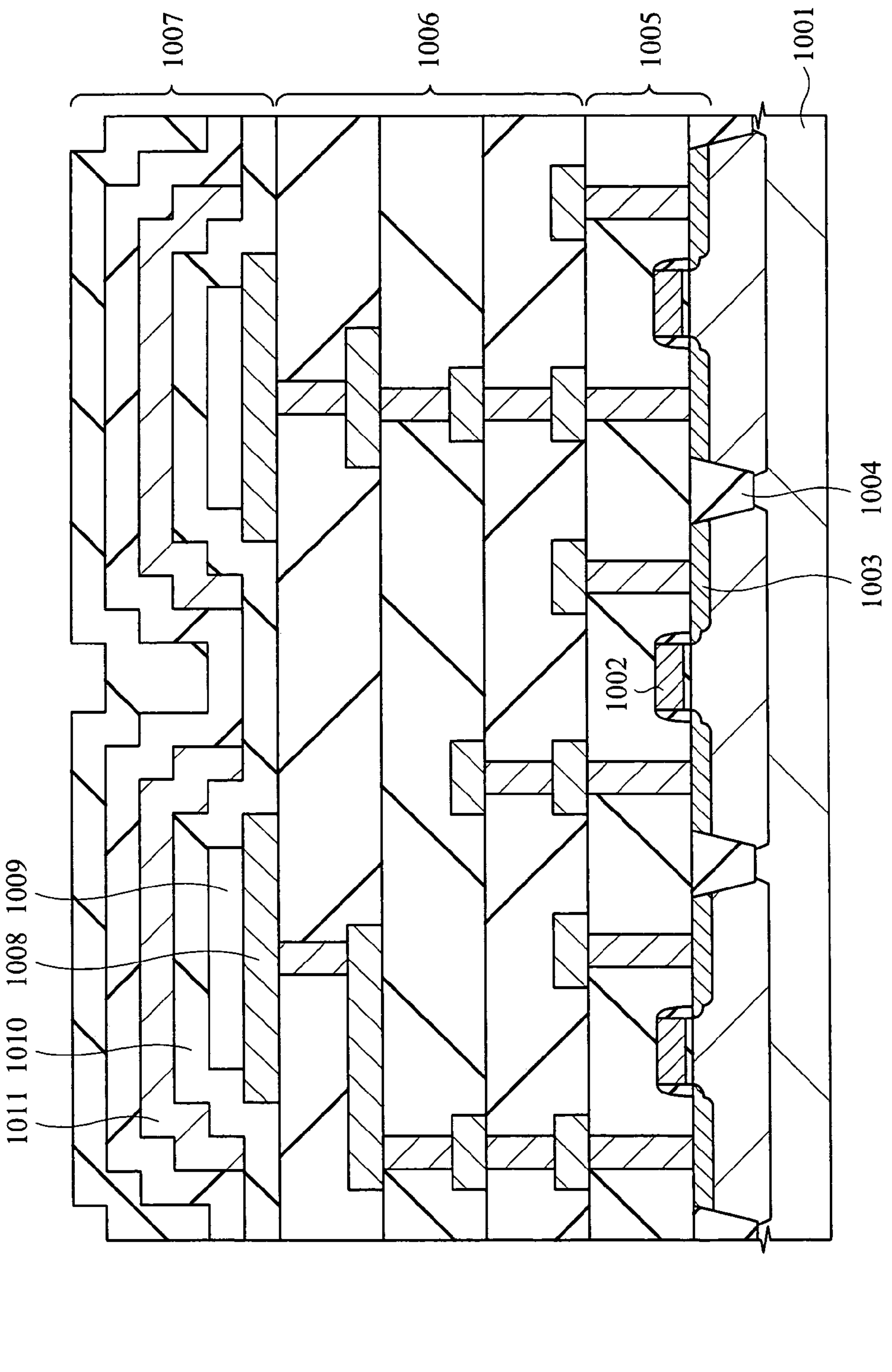
FIG. 18 is a cross-sectional view taken along the line A-A in FIG. 17.

FIG. 18 is a cross-sectional view taken along the line A-A in FIG. 17 showing the case where the CMUT array is formed on a signal processing circuit. A transistor layer 1005 including gate electrodes 1002, diffusion layers 1003, and device isolation regions 1004 is formed on a surface of a semiconductor substrate 1001 and a wiring layer 1006 is formed on the transistor layer 1005 through the ordinary LSI manufacturing process. CMUTs 1007 are formed on the wiring layer 1006.

The CMUT 1007 has a lower electrode 1008, a cavity 1009, an insulating film (membrane) 1010, and an upper electrode 1011. A size of the upper electrode 1011 is set to be larger than that of the cavity 1009. Specifically, for example, the lower electrode 1008, the cavity 1009, and the upper electrode 1011 are each formed in an approximately hexagonal shape, and a length of a diagonal line (diameter) of the upper electrode 1011 is about 60 μm and a length of a diagonal line (diameter) of the cavity 1009 is about 50 μm. Also, a length of a diagonal line (diameter) of the lower electrode 1008 is about 55 μm. Since the size of the upper electrode 1011 is set to be larger than that of the cavity 1009 like the second embodiment, a stacked film formed on the insulating film 1010 covering the cavity 1009 has uniform film quality and uniform film thickness. Therefore, distortion of the insulating film 1011 can be suppressed, and an operation of the CMUT as designed can be realized and the detection sensitivity can be improved.

Furthermore, since the size of the lower electrode 1008 is larger than the size of the cavity 1009 in the CMUT 1007 like the first embodiment and the insulating film 1010 has a shape which does not reflect the protrusion of the lower electrode 1008, operation reliability of the CMUT can be improved.

The method for manufacturing a CMUT according to the third embodiment is approximately similar to that according to the first embodiment, but the difference lies in that the size of the upper electrode is set to be larger than that of the cavity.

Note that the materials constituting the CMUT shown in the third embodiment are shown as one example of combination thereof like the first and second embodiments. The material for the upper electrode may be tungsten or another electrically conductive material. Also, the material for the sacrifice layer may be any material as long as it can secure the wet etching selectivity between the sacrifice layer and the material enclosing the sacrifice layer. Accordingly, a silicon oxide film, a polycrystalline silicon film, or a metal film may be used instead of the SOG film.

In the foregoing, the invention made by the inventors of the present invention has been concretely described based on the embodiments. However, it is needless to say that the present invention is not limited to the foregoing embodiments and various modifications and alterations can be made within the scope of the present invention.

The ultrasonic transducer according to the present invention can be widely utilized in the manufacturing industries of semiconductor devices.

What is claimed is:

1. An ultrasonic transducer comprising:

a first electrode which can be controlled independently by an individual ultrasonic transducer, said transducer formed on an uppermost layer of a semiconductor substrate on which transistors and wiring are formed;

a cavity layer which is formed on said first electrode;

an insulating film which is formed so as to directly cover all of said cavity layer in plan view; and a second electrode which is formed on said insulating film, wherein said insulating film is sandwiched between said cavity layer and said second electrode, wherein a size of said first electrode and a size of said second electrode are larger than that of said cavity layer, and wherein said first electrode and said second electrode are formed so as to include all of said cavity layer in plan view, and wherein the size of said second electrode is larger than the size of said first electrode.

2. The ultrasonic transducer according to claim 1, wherein said second electrode is formed so as to cover all of said first electrode in plan view.

* * * * *